(12) United States Patent  (10) Patent No.: US 8,916,890 B2
Chakraborty  (45) Date of Patent: Dec. 23, 2014

(54) LIGHT EMITTING DIODES WITH LIGHT FILTERS

(75) Inventor: Arpan Chakraborty, Goleta, CA (US)

(73) Assignee: Cree, Inc., Durham, NC (US)

( * ) Notice: Subject to any disclaimer, the term of this patent is extended or adjusted under 35 U.S.C. 154(b) by 1197 days.

(21) Appl. No.: 12/051,212

(22) Filed: Mar. 19, 2008

(65) Prior Publication Data

US 2009/0236619 A1  Sep. 24, 2009

(51) Int. Cl.
- *H01L 33/00* (2010.01)
- *H01L 33/50* (2010.01)
- *H01L 33/44* (2010.01)
- *H01L 33/46* (2010.01)

(52) U.S. Cl.
CPC .............. *H01L 33/50* (2013.01); *H01L 33/44* (2013.01); *H01L 33/46* (2013.01); *H01L 33/508* (2013.01)
USPC .................................. 257/98; 257/88; 257/89

(58) Field of Classification Search
USPC ................................................ 257/88, 89, 98
See application file for complete search history.

(56) References Cited

U.S. PATENT DOCUMENTS

| 5,803,579 | A | | 9/1998 | Turnbull et al. |
| 5,813,753 | A | | 9/1998 | Vriens et al. |
| 5,920,766 | A | * | 7/1999 | Floyd ............................. 438/35 |
| 6,132,072 | A | * | 10/2000 | Turnbull et al. ............... 362/494 |
| 6,155,699 | A | | 12/2000 | Miller et al. |
| 6,212,213 | B1 | | 4/2001 | Weber et al. |
| 6,234,648 | B1 | | 5/2001 | Börner et al. |
| 6,252,254 | B1 | * | 6/2001 | Soules et al. .................... 257/89 |
| 6,273,589 | B1 | | 8/2001 | Weber et al. |
| 6,513,949 | B1 | | 2/2003 | Marshall et al. |
| 6,538,371 | B1 | | 3/2003 | Duggal et al. |
| 6,550,949 | B1 | | 4/2003 | Bauer et al. |
| 6,552,495 | B1 | | 4/2003 | Chang |
| 6,577,073 | B2 | | 6/2003 | Shimizu et al. |
| 6,600,175 | B1 | | 7/2003 | Baretz et al. |
| 6,627,521 | B2 | * | 9/2003 | Furukawa et al. ............ 438/481 |
| 6,638,668 | B2 | | 10/2003 | Buchsbaum et al. |

(Continued)

FOREIGN PATENT DOCUMENTS

| EP | 1 566 848 | 8/2005 |
| JP | 10-163535 | 6/1998 |

(Continued)

OTHER PUBLICATIONS

Dichroic Filter Array Patented Patterned Coatings Technology, 2006 (at least as early as Sep. 2006), 2 pages.

(Continued)

*Primary Examiner* — Caleb Henry
(74) *Attorney, Agent, or Firm* — Robert S. Pyles

(57) ABSTRACT

LED chips including an LED layer or layers capable of emitting light of a first wavelength, a light conversion layer on the LED capable of converting at least a portion of the light of a first wavelength to light of a second wavelength, and a filter layer therebetween that is transmissive to light of a first wavelength and reflective to light of a second wavelength. The filter layer may prevent at least some of the light of a second wavelength from entering the LED layer or layers, where it may be subject to various optical losses, such as internal reflection and absorption. LED chips may also include multiple filter and light conversion layers. Methods of fabrication are also disclosed.

34 Claims, 10 Drawing Sheets

(56) References Cited

U.S. PATENT DOCUMENTS

| | | | |
|---|---|---|---|
| 6,642,652 B2* | 11/2003 | Collins et al. | 313/512 |
| 6,692,136 B2 | 2/2004 | Marshall et al. | |
| 6,730,940 B1 | 5/2004 | Steranka et al. | |
| 6,744,077 B2 | 6/2004 | Trottier et al. | |
| 6,784,463 B2 | 8/2004 | Camras et al. | |
| 6,817,735 B2 | 11/2004 | Shimizu et al. | |
| 6,841,804 B1 | 1/2005 | Chen et al. | |
| 6,914,267 B2 | 7/2005 | Fukasawa et al. | |
| 6,919,683 B1* | 7/2005 | Jang | 313/503 |
| 6,936,857 B2 | 8/2005 | Doxsee et al. | |
| 6,994,453 B2 | 2/2006 | Blanchard | |
| 7,004,602 B2 | 2/2006 | Waters | |
| 7,005,679 B2 | 2/2006 | Tarsa et al. | |
| 7,008,078 B2 | 3/2006 | Shimizu et al. | |
| 7,014,336 B1 | 3/2006 | Ducharme et al. | |
| 7,049,159 B2* | 5/2006 | Lowery | 438/22 |
| 7,066,623 B2 | 6/2006 | Lee et al. | |
| 7,083,304 B2* | 8/2006 | Rhoads et al. | 362/293 |
| 7,091,653 B2 | 8/2006 | Ouderkirk et al. | |
| 7,095,056 B2 | 8/2006 | Vitta et al. | |
| 7,157,745 B2* | 1/2007 | Blonder et al. | 257/98 |
| 7,157,839 B2 | 1/2007 | Ouderkirk et al. | |
| 7,195,944 B2* | 3/2007 | Tran et al. | 438/46 |
| 7,196,354 B1* | 3/2007 | Erchak et al. | 257/79 |
| 7,202,598 B2* | 4/2007 | Juestel et al. | 313/503 |
| 7,213,940 B1 | 5/2007 | Van De Ven et al. | |
| 7,230,222 B2* | 6/2007 | Cheng et al. | 250/205 |
| 7,301,175 B2* | 11/2007 | Izuno et al. | 257/98 |
| 7,361,938 B2* | 4/2008 | Mueller et al. | 257/94 |
| 7,411,220 B2* | 8/2008 | Horio et al. | 257/79 |
| 7,494,228 B2* | 2/2009 | Harbers et al. | 353/94 |
| 7,554,185 B2* | 6/2009 | Foong et al. | 257/686 |
| 7,615,789 B2* | 11/2009 | Tran | 257/79 |
| 7,675,075 B2* | 3/2010 | Nagai | 257/90 |
| 7,690,805 B2* | 4/2010 | Kubota et al. | 362/97.3 |
| 7,726,861 B2* | 6/2010 | Xu | 362/555 |
| 7,732,827 B2* | 6/2010 | Wang et al. | 257/98 |
| 7,772,604 B2* | 8/2010 | Duong et al. | 257/95 |
| 7,837,348 B2* | 11/2010 | Narendran et al. | 362/231 |
| 7,897,419 B2* | 3/2011 | Donofrio | 438/27 |
| 7,976,204 B2* | 7/2011 | Li et al. | 362/555 |
| 8,193,544 B2* | 6/2012 | Donofrio | 257/88 |
| 8,317,382 B2* | 11/2012 | Smith | 362/555 |
| 2001/0026124 A1* | 10/2001 | Liu et al. | 313/504 |
| 2002/0084748 A1 | 7/2002 | Ayala et al. | |
| 2002/0191183 A1* | 12/2002 | Tandon et al. | 356/320 |
| 2003/0030063 A1 | 2/2003 | Sosniak et al. | |
| 2003/0146411 A1 | 8/2003 | Srivastava et al. | |
| 2003/0207500 A1* | 11/2003 | Pichler et al. | 438/127 |
| 2004/0012958 A1* | 1/2004 | Hashimoto et al. | 362/241 |
| 2004/0105261 A1 | 6/2004 | Ducharme et al. | |
| 2004/0119086 A1* | 6/2004 | Yano et al. | 257/98 |
| 2004/0173806 A1* | 9/2004 | Chua | 257/98 |
| 2004/0217364 A1 | 11/2004 | Tarsa et al. | |
| 2005/0051782 A1* | 3/2005 | Negley et al. | 257/79 |
| 2005/0082974 A1 | 4/2005 | Fukasawa et al. | |
| 2005/0259439 A1* | 11/2005 | Cull et al. | 362/612 |
| 2006/0002141 A1 | 1/2006 | Ouderkirk et al. | |
| 2006/0012989 A1 | 1/2006 | Lee | |
| 2006/0062013 A1* | 3/2006 | Imade | 362/551 |
| 2006/0105482 A1 | 5/2006 | Alferink et al. | |
| 2006/0139580 A1* | 6/2006 | Conner | 353/98 |
| 2006/0145170 A1* | 7/2006 | Cho | 257/95 |
| 2006/0154389 A1* | 7/2006 | Doan | 438/21 |
| 2006/0157721 A1* | 7/2006 | Tran et al. | 257/98 |
| 2006/0158103 A1* | 7/2006 | Katano et al. | 313/504 |
| 2006/0203352 A1* | 9/2006 | Pashley | 359/634 |
| 2006/0255713 A1* | 11/2006 | Kondo et al. | 313/486 |
| 2007/0054149 A1* | 3/2007 | Cheng et al. | 428/690 |
| 2007/0145350 A1* | 6/2007 | Kobori | 257/13 |
| 2007/0182299 A1* | 8/2007 | Ouderkirk et al. | 313/110 |
| 2007/0205423 A1* | 9/2007 | Yamazaki et al. | 257/89 |
| 2007/0215890 A1* | 9/2007 | Harbers et al. | 257/98 |
| 2007/0258229 A1 | 11/2007 | Weaver et al. | |
| 2007/0284565 A1* | 12/2007 | Leatherdale et al. | 257/13 |
| 2007/0284567 A1* | 12/2007 | Pokrovskiy et al. | 257/13 |
| 2007/0284592 A1* | 12/2007 | Haase | 257/79 |
| 2007/0291491 A1* | 12/2007 | Li et al. | 362/307 |
| 2008/0006815 A1* | 1/2008 | Wang et al. | 257/13 |
| 2008/0054281 A1* | 3/2008 | Narendran et al. | 257/98 |
| 2008/0094829 A1* | 4/2008 | Narendran et al. | 362/231 |
| 2008/0121911 A1* | 5/2008 | Andrews et al. | 257/98 |
| 2008/0130265 A1 | 6/2008 | Negley et al. | |
| 2008/0142816 A1* | 6/2008 | Bierhuizen et al. | 257/82 |
| 2008/0144331 A1* | 6/2008 | Xu | 362/554 |
| 2008/0179611 A1* | 7/2008 | Chitnis et al. | 257/98 |
| 2008/0231953 A1* | 9/2008 | Young | 359/495 |
| 2008/0247172 A1* | 10/2008 | Beeson et al. | 362/308 |
| 2008/0251799 A1* | 10/2008 | Ikezawa | 257/89 |
| 2008/0303039 A1* | 12/2008 | Craford et al. | 257/89 |
| 2009/0001389 A1* | 1/2009 | Wang et al. | 257/89 |
| 2009/0001390 A1* | 1/2009 | Yan et al. | 257/89 |
| 2009/0146158 A1* | 6/2009 | Park | 257/89 |

FOREIGN PATENT DOCUMENTS

| | | |
|---|---|---|
| JP | 2003-515956 | 5/2003 |
| JP | 2003-529889 | 10/2003 |
| JP | 2004080046 | 3/2004 |
| JP | 2004-103443 | 4/2004 |
| JP | 2004-356116 | 12/2004 |
| JP | 2005-142311 | 6/2005 |
| WO | 2004068597 | 8/2004 |
| WO | 2004100226 | 11/2004 |
| WO | 2005124877 | 12/2005 |
| WO | 2008079161 | 7/2008 |

OTHER PUBLICATIONS

Van De Ven et al., "Warm White Illumination with High CRI and High Efficacy by Combining 455nm Excited Yellowish Phosphor LEDs and Red AlInGaP LEDs", First International Conference on White LEDs and Solid State Lighting.

Cree® XLamp® 7090 XR-E Series LED Binning and Labeling.

\* cited by examiner

LIGHT EMITTING DIODES WITH LIGHT FILTERS

This invention was made with Government support under Contract USAF 05-2-5507. The Government has certain rights in this invention.

BACKGROUND

The present invention relates to light emitting diodes with light filters and methods of manufacturing thereof.

Solid state light emitting devices, such as inorganic or organic Light Emitting Diodes (LED or LEDs), convert energy to light and are widely used for many applications. As known to those having skill in the art, inorganic solid state devices generally include one or more active regions of semiconductor material sandwiched between oppositely doped regions. When a bias is applied across the doped regions, electron-hole recombination events occur to generate light and in turn, light is emitted from the active region in omnidirectional paths and from all surfaces of the LED. Conventional LEDs may incorporate reflectors and/or mirror surfaces to direct the emitted light in a desired direction.

The color or wavelength emitted by an LED is largely dependent on the materials from which it is formed and its resulting materials properties, such as the bandgap of the active region. These colors or wavelengths include red, yellow, green, and blue in the visible spectrum as well as the ultraviolet (UV) portions of the electromagnetic spectrum. It is often desirable to incorporate phosphor into a light emitting diode, to enhance the emitted light in a particular wavelength and/or to convert at least some of the light to another wavelength. As used herein, the term "phosphor" is used generically for any photoluminescent material. The phosphor may be located anywhere within the LED device and may be formed using many techniques.

For example, phosphor may be coated inside and/or outside a dome-shaped shell that covers the device and/or included within the shell itself. The phosphor may be located remotely from the light emitting die or it may be coated or deposited on the die itself. These techniques may include electrophorectic deposition, stencil printing, spin or spray coating, etc. Other techniques may include a phosphor dispense, where a drop of material, such as epoxy, silicone encapsulant, etc., that contains phosphor therein, may be placed on the die and cured to form a shell over the die. This technique may be referred to as a "glob top". In other techniques, the drop of material that contains phosphor may be placed on the die and the phosphor may be allowed to settle on the die. This technique may be referred to as "remote settling".

It is often desirable to configure a light emitting device to emit white light. As used herein, the term "white light" is used in a general sense and includes light that different individuals or detectors may perceive as having a slight tint toward, for example, yellow or blue. Conventional LED devices may combine a yellow phosphor on a blue LED to achieve white light. Some of the blue light emitted from the LED passes through the phosphor without being converted and some of the emitted blue light is down-converted to yellow. The combinations of blue light and yellow light that escape the light emitting device provide visible white light output.

SUMMARY OF THE INVENTION

The present invention discloses light emitting devices with improved light extraction efficiency. Some embodiments of the present invention disclose an LED chip that comprises an LED layer or layers capable of emitting light of a first wavelength, at least one light conversion layer on the LED layer capable of converting at least a portion of the light of a first wavelength to light of a second wavelength, and at least one filter layer therebetween that is transmissive to light of a first wavelength and reflective to light of a second wavelength. The filter layer(s) may prevent at least some of the light of a second wavelength from entering the LED layer(s) or any other underlying layers where it may be subject to various optical losses, such as total internal reflection and absorption, thereby increasing the overall efficiency of the LED chip. In some embodiments, the filter layer(s) may comprise one or more layers of dielectric material.

The present invention also discloses methods for fabricating such devices. In some embodiments, a method of fabrication may include providing a plurality of LED chips on a substrate, each capable of emitting light of a first wavelength. Pedestals may then deposited on the LEDs, each of the pedestals being in electrical contact with one of the LED chips. A filter layer and a light conversion layer may then be formed over and covering the LED chips and pedestals. The light conversion layer may be capable of converting at least a portion of the light of a first wavelength into light of a second wavelength and the filter coating may be transmissive to light of a first wavelength and reflective to light of a second wavelength. The filter and light conversion layers may then be planarized to expose at least some of the covered pedestals. In some embodiments, the fabrication may be carried out on a wafer level and in other embodiments, the fabrication may be performed on individual chips.

These and other aspects and advantages of the invention will become apparent from the following detailed description and the accompanying drawings that illustrate by way of example the features of the invention.

DETAILED DESCRIPTION OF EMBODIMENTS OF THE INVENTION

Figure 1:
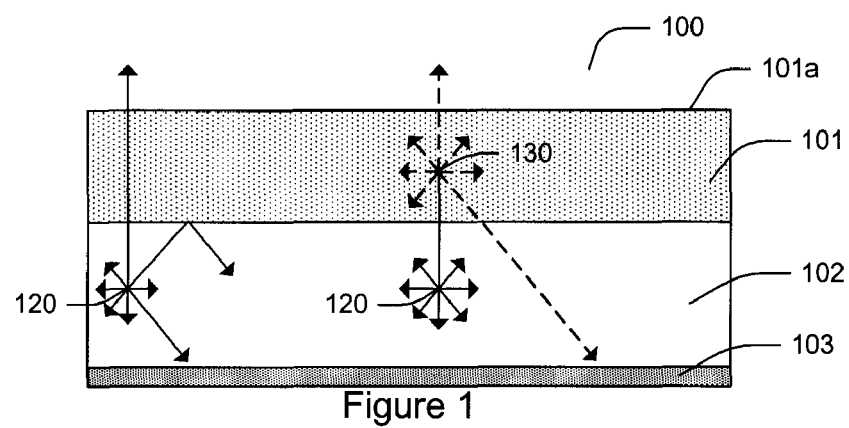
FIG. 1 is a cross-sectional view depicting light paths within light emitting diodes.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

The present invention is described herein with reference to certain embodiments but it is understood that the invention may be embodied in many different forms and should not be construed as limited to the embodiments set forth herein. In particular, the present invention is described below in regards to coating LEDs with a light filter coating and a light conversion coating. The light filter coating typically comprises one or more dielectric layers that are transmissive to light of certain wavelengths while reflective to light of other wavelengths, but it is understood that the present invention may be used to coat LEDs with other materials that function in a similar manner. The light conversion coating typically comprises a phosphor loaded binder ("phosphor/binder coating"), but it is understood that the present invention may be used to coat LEDs with other materials for down-conversion, protection, light extraction or scattering. It is also understood that the phosphor binder may have scattering or light extraction particles or materials, and that the coating may be electrically active. The methods according to the present invention may also be used for coating other semiconductor devices with different materials.

Additionally, single or multiple coatings and/or layers may be formed on the LEDs for light filtering and/or light conversion. A coating may include no phosphors, one or more phosphors, scattering particles and/or other materials. A coating may also comprise a material such as an organic dye that provides down-conversion. With multiple coatings and/or layers, each one may include different phosphors, different scattering particles, different optical properties, such as transparency, reflectivity, index of refraction, and/or different physical properties, as compared to other layers and/or coatings.

Some embodiments of the present invention arise from the realization that the efficiency of visible light emitted by an LED device may be limited because not all light generated inside the LED device is able to escape. This may be due to various optical losses, such as internal reflection and absorption. FIG. 1 generically describes light loss in an LED device or chip 100, the LED chip 100 comprising a semiconductor LED or LED layer 102 capable of emitting light of a first wavelength 120 (depicted by solid lines), a light conversion layer 101 on the LED layer 102 capable of converting at least a portion of the light of a first wavelength 120 to light of a second wavelength 130 (depicted by dashed lines), and a mirror or reflector layer 103 on a side of the LED layer 102 opposite the light conversion layer 101. The LED layer 102 may comprise multiple layers of materials such as silicon carbide, sapphire, gallium nitride, aluminum gallium nitride, indium gallium nitride, aluminum indium gallium nitride, gallium arsenide, aluminum indium gallium arsenide, aluminum indium gallium phosphide, zinc oxide and/or any other single element or compound semiconductor material arranged as a single layer or a multilayer stack configured to emit light. The LED layer arrangement generally includes one or more active regions of semiconductor material sandwiched between oppositely doped n-type and p-type regions, the design and fabrication of which are known to those having skill in the art and need not be described in detail herein. The light conversion layer 101 may include a phosphor, polymer, or die capable of converting the wavelength of at least a portion of the LED light. In some embodiments, the LED layer 102 may comprise Group III-Nitride materials configured to emit blue light and the light conversion layer 101 may comprise a yellow phosphor, such as cerium-doped yttrium aluminum garnet (Ce:YAG). Group III-Nitrides refer to those semiconductor compounds formed between nitrogen and the elements in the Group III column of the periodic table, usually aluminum (Al), gallium (Ga), and indium (In), an example compound being gallium nitride (GaN). The term also refers to ternary and quaternary compounds such as aluminum gallium nitride (AlGaN) and aluminum indium gallium nitride (AlInGaN). The reflector layer 103 may comprise any material reflective to light, such as metals including silver, nickel silver, platinum, aluminum, etc and semiconductor reflectors such as a distributed Bragg reflector (DBR). In some configurations, the reflector layer may also be an electrical conductor.

Light of a first wavelength 120 (depicted by solid lines) may be generated and emit from LED layer 102 in omnidirectional paths. Some of the light generated by LED layer 102 may enter the light conversion layer 101 and be converted to light of a second wavelength 130 (depicted by dashed lines) that also emits in omnidirectional paths. A portion of the light of first wavelength 120 and second wavelength 130 may escape the device through a light conversion layer surface 101a to provide visible light. Another portion of the light of first wavelength 120 and second wavelength 130 may follow a path or be reflected away from surface 101a, some of which may be reflected back by reflector layer 103. However, reflector layer 103 may not be a perfect reflector and may actually absorb some light. For example, a silver reflector may absorb around 5% or more of incident light. Additionally, light that is internally reflected by the reflector layer 103 or the interface between other layers, such between the LED layer 102 and the light conversion layer 101, may eventually be internally absorbed.

Figure 2A:
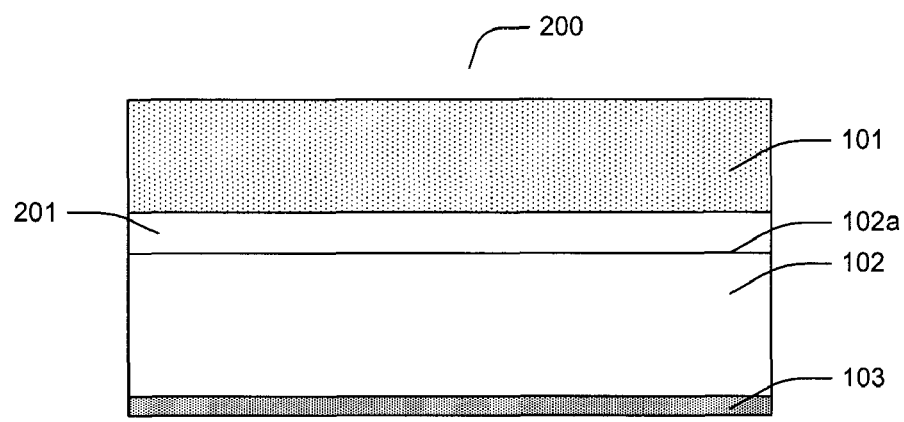
FIGS. 2A-2B are cross-sectional views of light emitting diodes according to various embodiments of the present invention.
Figure 2B:
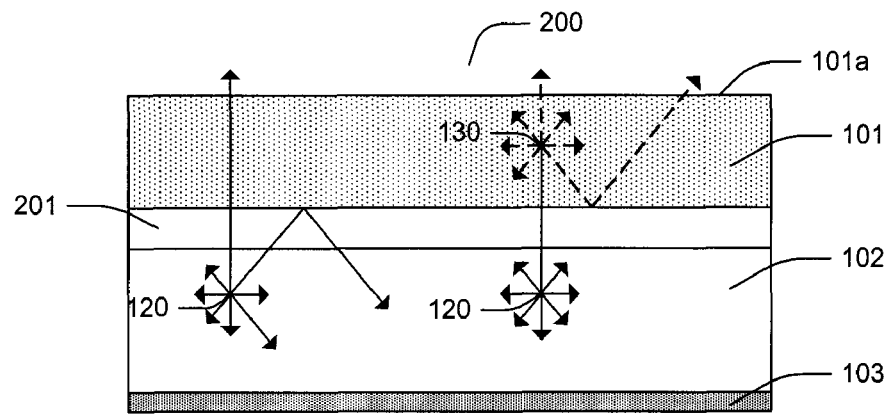

FIGS. 2A-2B are cross-sectional views of LED devices or chips according to various embodiments of the present invention. LED chip 200 may be provided with an LED or LED layer 102 capable of emitting light of a first wavelength 120 (depicted by solid lines), a light conversion layer 101 on the LED layer 102 capable of converting at least a portion of the light of a first wavelength 120 to light of a second wavelength 130 (depicted by dashed lines), and an optional mirror or reflector layer 103 on a side of the LED layer 102 opposite the light conversion layer 101. LED chip 200 further comprises a coating or filter layer 201 provided between LED layer 102 and light conversion layer 101. Filter layer 201 may be transmissive to light of a first wavelength 120 and reflective to light of a second wavelength 130. Therefore, converted light of a second wavelength 130 may remain in light conversion layer 101. This may limit internal light loss elsewhere in the device, such as absorption in reflector layer 103, and allow more converted light of a second wavelength 130 to escape through surface 101a. In some embodiments, filter layer 201 may be directly on LED layer 102 and/or the light conversion layer 101 may be directly on filter layer 201.

Figure 3A:
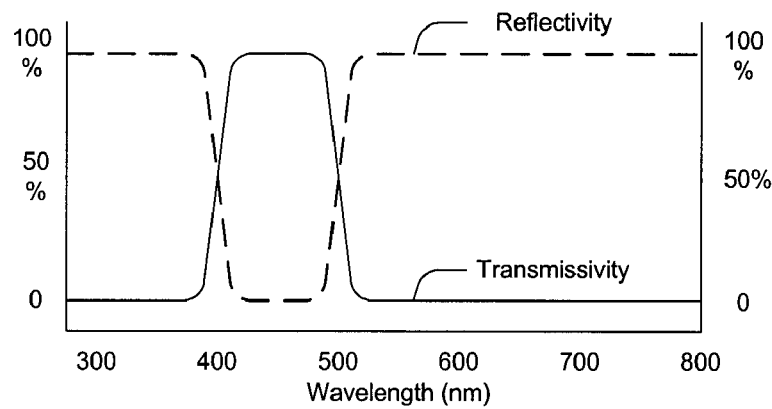
FIGS. 3A-3C are graphs depicting materials properties and light spectrum according to various embodiments of the present invention.
Figure 3B:
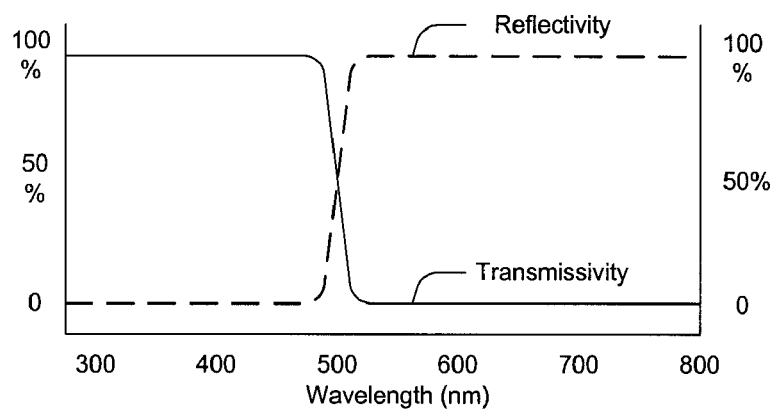
Figure 3C:
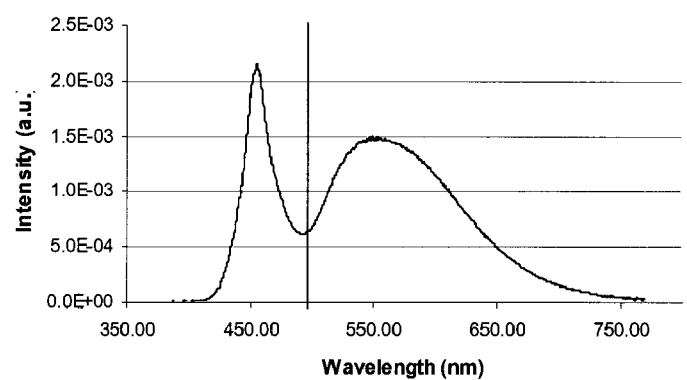

The filter layer 201 may be a dielectric layer or a stack of dielectric layers including materials such as $TiO_2$, $SiO_2$, $MgF_2$, $Nb_2O_5$, $ZrO_2$, $Ta_2O_5$, $Al_2O_3$, $HfO_2$, ZnS, $Na_3AlF_6$, $PbCl_2$, etc or combinations thereof. Unlike metal reflectors, a filter layer may be at or near 100% transmissive at certain wavelengths while at or near 100% reflective for other wavelengths with absorption preferably less than 1% In other embodiments, a filter layer may be at or near 95% transmissive at certain wavelengths while at or near 95% reflective for other wavelengths. In still further embodiments, a filter layer may be at or near 90% transmissive at certain wavelengths while at or near 90% reflective for other wavelengths. In some embodiments, the LED layer 102 may comprise GaN and may be configured to emit a first light in the range of 400-500 nm. The light conversion layer 101 may comprise Ce:YAG phosphor that converts a portion of the 400-500 nm light to a second light of a longer wavelength. The filter layer may then be configured, for example, according to FIG. 3A or 3B. Referring to FIG. 3A, the filter layer may be configured as a band pass filter, being at or near 100% transmissive to light in the range of 400 nm and 500 nm (depicted by the solid line) and at or near 100% reflective to light below 400 nm and above 500 nm (depicted by the dashed line). Referring to FIG. 3B, the filter layer may also be configured as an edge filter, being at or near 100% transmissive to light below and including 500 nm (depicted by the solid line) and at or near 100% reflective to light above 500 nm (depicted by the dashed line). FIG. 3C shows an example emission spectrum, including both first light and second light of a longer wavelength with a single vertical line to represent the amount of light of longer wavelength that may be reflected at 500 nm from an edge filter. This spectrum may produce a blue-tinted, or cool white light.

In some embodiments, the filter layer 201 may have a thickness of less than 20 μm while in further embodiments, the filter layer may have a thickness of less than 10 μm. The filter layer thickness may be determined based its absorption characteristic and the smoothness of its desired reflectance/transmittance profile. In additional embodiments, the refractive index of the filter layer 201 may be configured to further improve light extraction. For example, the filter layer 201 may have an index of refraction that is the same as light conversion layer 101, while in other embodiments the filter layer 201 may have an index of refraction intermediate that of the LED layer 102 and the light conversion layer 101. In some embodiments, the LED layer 102 may comprise GaN, which has a relatively high refractive index of about ~2.5 and the light conversion layer 101 may comprise Ce:YAG phosphor with a refractive index around ~1.8. Light escaping the surface of GaN may be limited to a narrow incidence angle with the rest being internally reflected. The surface of LED layer 102 comprising GaN may be textured or patterned to increase the likelihood of first pass light escaping. To further minimize internal reflections in these embodiments, the refractive index of the filter layer 201 may either be 1.8 or slightly higher, but less than 2.5.

The LED layer 102 may contain multiple semiconductor layers configured to emit light. Such layers may include oppositely doped n-type and p-type semiconductor layers sandwiched around an active layer. The n-type layer and the p-type layer may include multiple n-type layers and multiple p-type layers respectively. The active layer may comprise single quantum well (SW), multiple quantum well (MQW), double heterostructure and/or super lattice structures. In some embodiments, the filter layer 201 may be on or closest to the n-type layer and the p-type layer may be on or closest to reflector layer 103. In further embodiments, at least a portion of filter layer 201 may be directly on the n-type layer and/or at least a portion of the p-type layer may be directly on reflector layer 103. In other embodiments, the filter layer 201 may be on or closest to the p-type layer and the n-type layer may be on or closest to reflector layer 103. In further embodiments, at least a portion of the filter layer 201 may be directly on the p-type layer and/or at least a portion of the n-type layer may be directly on reflector layer 103. The LED layer 102 may include additional layers and elements, including but not limited to buffer, nucleation, contact and current spreading layers as well as light extraction layers and elements. For example, a surface 102a of LED layer 102 may patterned or textured. In some embodiments, the LED layer 102 may comprise an n-type semiconductor layer, an active layer, and a p-type semiconductor layer and the surface 102a may comprise a textured or patterned surface of the n-type layer. The surface 102a is shown in FIG. 2A as the top of LED layer 102, but it is understood that any or all surfaces, including the bottom and the sides may also be patterned or textured.

Embodiments of the present invention may be fabricated by many different manufacturing methods. Each method generally includes fabricating an LED, fabricating a light conversion layer or coating on the LED, and fabricating a light filter layer or coating therebetween. The steps of fabricating the light conversion and light filter layers may take place on an LED chip level or LED wafer level. As used herein, the terms "chip level" and "LED chip level" are used generically for any fabrication steps performed on individual LEDs and the terms "wafer level" and "LED wafer level" are used generically for any fabrication steps performed on multiple LEDs positioned on a common substrate or wafer. Wafer level manufacturing techniques that may be particularly well suited for incorporation with the present invention are described in U.S. application Ser. No. 11/656,759 filed Jan. 22, 2007 to Chitnis et al, entitled Wafer Level Phosphor Coating Method and Devices Fabricated Utilizing Method, and U.S. application Ser. No. 11/899,790 filed Sep. 7, 2007 to Chitnis et al, entitled Wafer Level Phosphor Coating Method and Devices Fabricated Utilizing Method, both assigned to the assignee of the present invention, the disclosure of which is hereby incorporated herein by reference in its entirety as if set forth fully herein.

For wafer level fabrication, the present invention allows coating of LEDs with a light filter layer (e.g. dielectric) and a light conversion layer (e.g. phosphor) while still allowing access to one or more LED contacts for wire bonding. According to one aspect of the present invention, electrically conducting pedestals/posts are formed on one or more LED contacts (bond pads) while the LEDs are at the wafer level. These pedestals can be fabricated using known techniques such as electroplating, electroless plating, stud bumping, or vacuum deposition. The wafer can then be blanket coated with a light filter layer and a light conversion layer, burying the LEDs, contacts and pedestals. Each of the pedestals act as a vertical extension of its contact, and although the blanket coating with the down-converter coating temporarily covers the pedestals, the coating can be planarized and thinned to expose the top surface or top portion of the pedestals. The pedestals should be tall enough (10-200 µm) to project through the desired final coating thickness, with a typical height range of 20-100 µm. After planarizing the pedestals are exposed for external connection such as by wire bonding. This process occurs at the wafer level and as a subsequent fabrication step, the individual LEDs chips can be separated/singulated from the wafer using known processes.

Figure 4A:
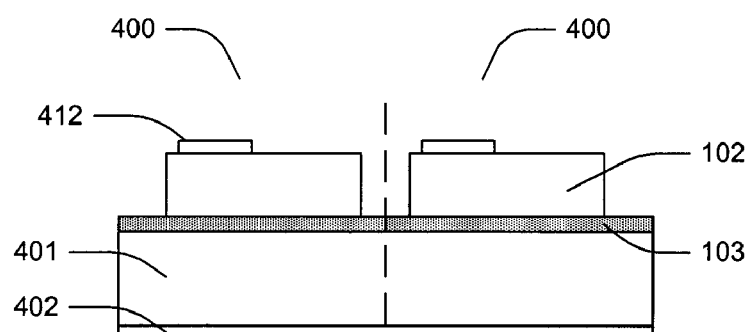
FIGS. 4A-4F are cross-sectional views of light emitting diodes according to various embodiments of the present invention during intermediate fabrication thereof.

FIGS. 4A-4F show cross-sectional views of light emitting devices according to various embodiments of the present invention during intermediate fabrication thereof. Referring to FIG. 4A, the LED chips 400 are shown at a wafer level of their fabrication process. That is, the chips 400 have not been through all the steps necessary before being separated/singulated from wafer into individual devices. A vertical dashed line is included to show a separation or dicing line between the LED chips 400 and following additional fabrication steps, and shown in FIG. 4F, the LED chips 400 can be separated into individual devices. FIGS. 4A-4F also show only two devices at the wafer level, but it is understood that many more LED devices can be formed from a single wafer. For example, when fabricating LED devices having a 1 millimeter (mm) square size, up to 4500 LED devices can be fabricated on a 3 inch wafer. Typical thicknesses for LED chips may be 50 µm, 100 µm, 200 µm, and as high as 600 µm and beyond.

Each of the LED chips 400 comprises a semiconductor LED 102 as described for previous embodiments. The LED chips 400 are shown as separate devices on a substrate 401. This separation can be achieved by having portions of the semiconductor LED layer 102 etched to form open areas between the LED chips 400. In other embodiments, the semiconductor LED layer 102 may remain continuous on the substrate 401 and can be separated when the LED chips 400 are singulated.

A substrate may be a growth substrate or a carrier substrate. In some embodiments, the substrate may have a diameter of about 3 inches. It is understood that substrates may come in many sizes larger and smaller than 3 inches, all of which may be used in various embodiments of the present invention. A growth substrate typically is used in the fabrication of the semiconductor LED layer 102 and may be made of many materials such as sapphire, silicon carbide, silicon, silicon on insulator, germanium, aluminum nitride, and gallium nitride. A suitable growth substrate for a Group III-Nitride based semiconductor layers is 4H or 6H polytype silicon carbide, although other silicon carbide polytypes may be used including 3C and 15R. Silicon carbide substrates are available from Cree, Inc., of Durham, N.C. and methods for producing them are set forth in the scientific literature as well as in U.S. Pat. Nos. Re. 34,861; 4,946,547; and 5,200,022.

The substrate 401 in FIGS. 4A-4F may also be a carrier substrate. Suitable carrier substrates may include silicon, metal alloys such as copper alloys, single crystalline phosphors, etc. For these embodiments, the semiconductor LED layer 102 is flip-wafer or flip-chip bonded to the carrier substrate 401. A flip-wafer or flip-chip process typically involves first growing an LED device including, in order, a n-type region, an active region, and by a p-type region on a growth substrate and then transferring or mounting it to the carrier substrate. The transferring/mounting step usually involves flipping the LED device and growth substrate over and mounting it such that the p-type region is closest to the carrier substrate. The LED device may be mounted to the carrier substrate by one or more bonding/metal layers. The bonding/ metal layers may comprise a reflector or reflector layer 103 arranged to reflect light emitted or reflected in a direction toward the substrate 401 back toward the top of the device. The growth substrate may then be removed using a known grinding and/or etching process that may expose at least a portion of the n-type region. The n-type region may then be patterned, shaped, or textured to enhance light extraction. In other embodiments, the growth substrate or at least portions thereof remain. The growth substrate or the remaining portions may then be patterned, shaped, or textured to enhance light extraction. Example manufacturing techniques may be described in U.S. Publication No. 20060049411 filed May 18, 2004 to Nakamura et al, entitled Method For Fabricating Group-III Nitride Devices and Devices Fabricated Using Method, and U.S. Publication No. 20060189098 filed Feb. 23, 2005 to Edmond, entitled Substrate Removal Process For High Light Extraction LEDs, and U.S. Publication No. 20060060877 filed Sep. 22, 2004 to Edmond et al, entitled High Efficiency Group III Nitride-Silicon Carbide Light Emitting Diode, and U.S. Publication No. 20060060874 filed Mar. 17, 2005 to Edmond et al, entitled High Efficiency Group III Nitride LED With Lenticular Surface, all assigned to the assignee of the present invention, the disclosures of which are hereby incorporated herein by reference in their entirety as if set forth fully herein.

Each of the LED chips 400 may have first and second contacts 402 and 412. FIGS. 4A-4F show vertical geometry devices with the first contact 402 being on the substrate 401 and the second contact 412 on the LED layer 102. The first contact 402 is shown as one layer on the substrate, but when the LED chips 400 are singulated, the first contact 402 will also be separated such that each chip 400 has its own portion of the first contact 402. It is understood that first and second contacts 402 and 412 may comprise a metal such as platinum (Pt), silver (Ag), nickel (Ni), an alloy thereof, or a transparent conductive oxide such as indium tin oxide (ITO). As would be understood by one of skill in the art with the benefit of this disclosure, the present invention may also be used with LEDs having a lateral geometry wherein both contacts are on the same side of the chip.

Figure 4B:
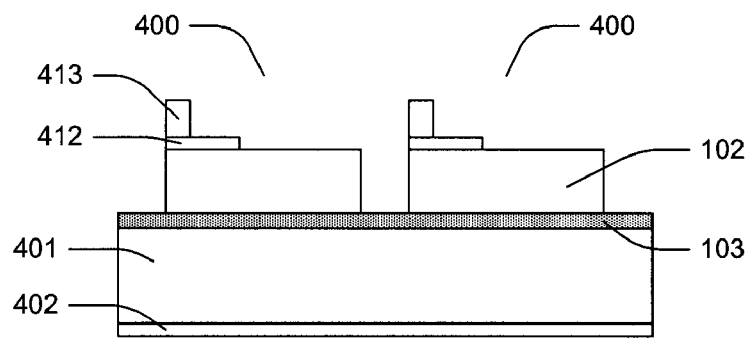

Referring now to FIG. 4B, a contact pedestal 413 may be formed on the second contact 412 that is utilized to make electrical contact to the second contact 412 after various coatings are applied. The pedestal 413 may be formed of many different electrically conductive materials and can be formed using many different known physical or chemical deposition processes such as electroplating, electroless plating, or stud bumping, with the preferred contact pedestal 413 being gold (Au) and formed using stud bumping. This method is typically the easiest and most cost effective approach. The pedestal 413 can be made of other conductive materials beyond Au, such as copper (Cu) or nickel (Ni) or Indium (In), or combinations thereof. For the vertical geometry type chip 400 shown in FIGS. 4A-4F, only one pedestal 413 is needed. In alternative embodiments related to lateral geometry or large-area vertical geometry chips, additional pedestals may also be formed.

The process of forming stud bumps is generally known and only discussed briefly herein. Stud bumps are placed on the contacts (bond pads) through a modification of the "ball bonding" process used in conventional wire bonding. In ball bonding, the tip of the bond wire is melted to form a sphere. The wire bonding tool presses this sphere against the contact, applying mechanical force, heat, and/or ultrasonic energy to create a metallic connection. The wire bonding tool next extends the gold wire to the connection pad on the board, substrate, or lead frame, and makes a "stitch" bond to that pad, and finishes by breaking off the bond wire to begin another cycle. For stud bumping, the first ball bond is made as described, but the wire is then broken close to the ball. The resulting gold ball, or "stud bump" remains on the contact and provides a permanent, reliable connection through the underlying contact metal. The stud bumps can then be flattened (or "coined") by mechanical pressure to provide a flatter top surface and more uniform bump heights, while at the same time pressing any remaining wire into the ball.

Figure 4C:
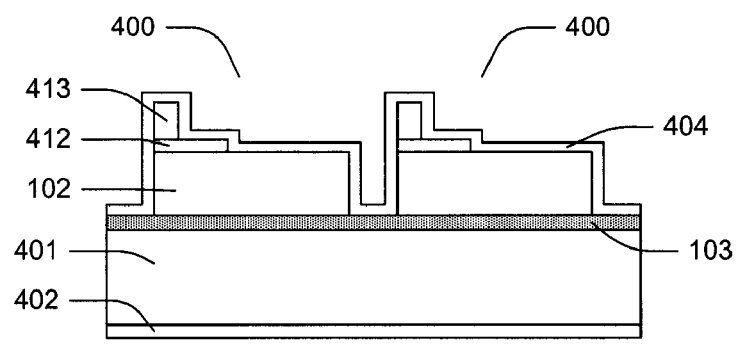
Figure 4D:
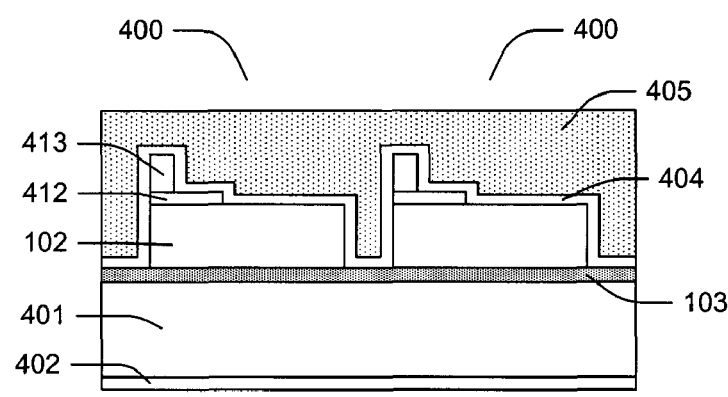

Referring now to FIG. 4C, the chips 400 are blanketed by a filter layer 404 that covers each chip 400 and its contact 412. Many different methods may be used for forming filter layer 404, including various physical and/or chemical deposition techniques such as vacuum or thermal evaporation, sputtering, chemical vapor deposition, plasma enhanced chemical vapor deposition, oxidation, and the direct material spraying The thickness of filter layer 404 may be configured such that it covers both the tops and mesa sidewalls of each chip 400, including its pedestal 413, and contact 412. In FIG. 4D, the chips 400 are then blanketed by a light conversion layer 405 using techniques such as electrophorectic deposition, spin or spray coating, screen printing, and/or dispensing. The combination of filter layer 404 and light conversion layer 405 has a total thickness such that it may cover/bury the pedestal 413. The present invention may provide the advantage of depositing the filter layer 404 and light conversion layer 405 at the wafer level without the need for alignment over particular devices or features. Instead, the entire wafer is covered, which provides for a simpler and more cost effective fabrication process. In order to maintain the integrity of the LED chips 400, it may be preferable to perform the fabrication of filter layer coating and light conversion layers at temperatures below 300 C, and preferably below 250 C.

Figure 4E:
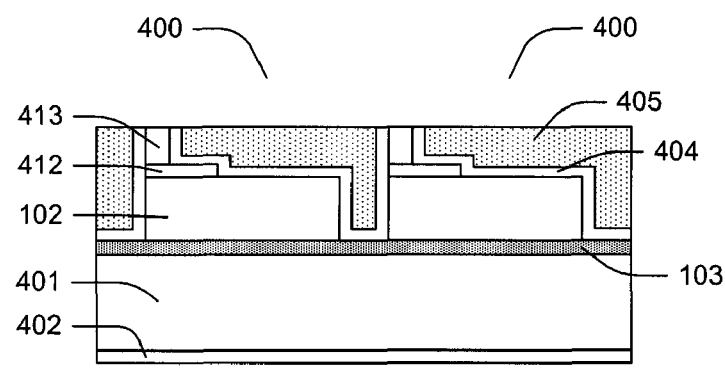

Referring now to FIG. 4E, the filter layer 404 and light conversion layer 405 are thinned or planarized so that the pedestals 413 are exposed through the coating's top surfaces. Many different thinning processes can be used including known mechanical or chemical processes such as grinding, lapping, polishing, the use of a squeegee, and physical or chemical etching. The thinning process not only exposes the pedestals 413, but also allows for planarizing and controlling the thickness of the light conversion layer 405, which in some embodiments may control the intensity and the color point of the emitted light by controlling the amount of phosphor present.

Figure 4F:
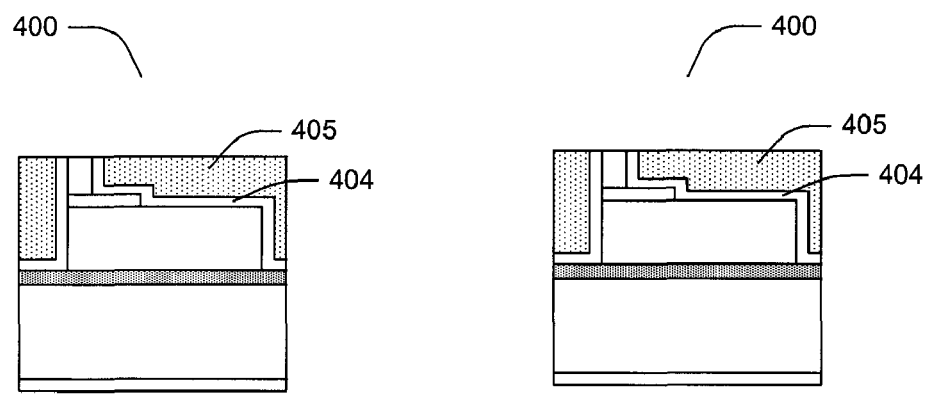

Referring now to FIG. 4F, individual chips 400 may be singulated using known methods such as dicing, scribe and breaking, or etching. The singulating process separates each of the chips 400 with each having substantially the same thickness of filter layer 404 and light conversion layer 405, and as a result, substantially the same amount of phosphor and emission characteristics. This allows for reliable and consistent fabrication of LED chips 400 having similar emission characteristics. Following singulating, the LED chips may be mounted in a package, or to a submount or printed circuit board (PCB) without the need for further processing to add phosphor. In one embodiment the package/submount/ PCB may have conventional package leads with the pedestals electrically connected to the leads. A conventional encapsulation may then surround the LED chip and electrical connections. In another embodiment, the LED chip may be enclosed by a hermetically sealed cover with an inert atmosphere surrounding the LED chip at or below atmospheric pressure. In some embodiments, the LED chips may be packaged for general illumination purposes, such as interior or exterior lighting. In other embodiments, the LED chips may be packaged to backlight a display screen, such as a liquid crystal display (LCD).

Figure 5A:
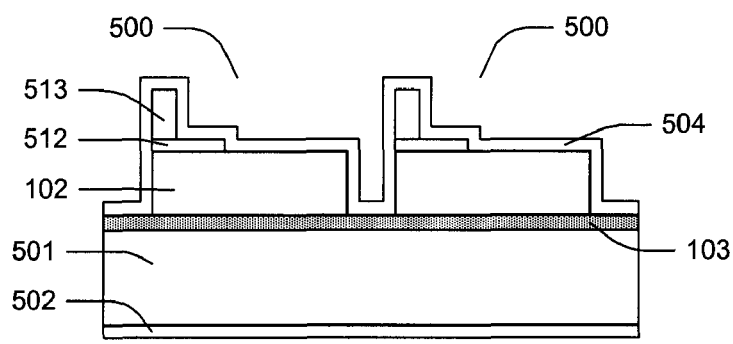
FIGS. 5A-5C show cross-sectional views of light emitting devices according to various embodiments of the present invention during intermediate fabrication thereof.
Figure 5B:
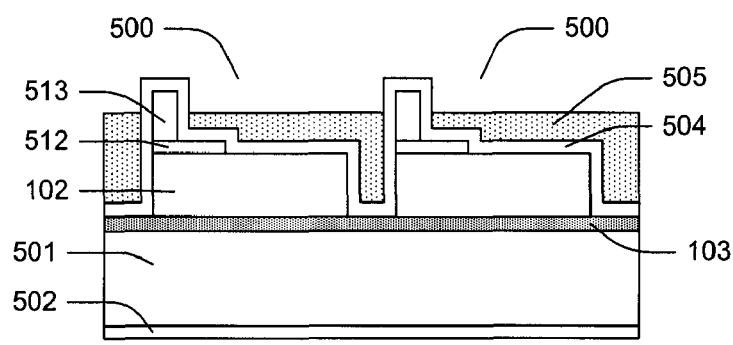
Figure 5C:
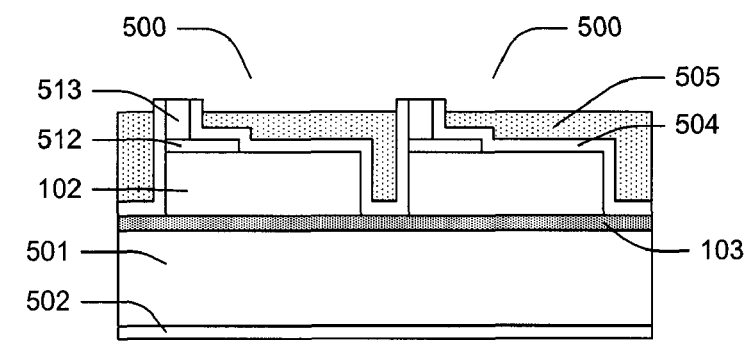

FIGS. 5A-5C show cross-sectional views of light emitting devices according to various other embodiments of the present invention during intermediate fabrication thereof. Referring to FIG. 5A, LED chips 500 may be provided according to previous embodiments that may include LED layer 102, reflector or reflector layer 103, substrate 501, first and second contacts 502 and 512 respectively, pedestals 513, and filter layer 504. Referring to FIG. 5B, light conversion layer 505 may then be formed over LED chips 500 using techniques such as screen printing where a portion of pedestals 513 and filter layer 504 are not covered by light conversion layer 505. As shown in FIG. 5C, portions of filter layer 504 may then be planarized to expose pedestals 513. In other embodiments, portions of filter layer 504 and portions of pedestals 513 may be planarized. After planarization, the height of pedestals 513 may be even with light conversion layer 505 or slightly raised from it.

The present invention may also be used to cover individual LED chips instead of those formed in an LED chip wafer. In these embodiments, the LED chips may be singulated and then mounted in a package or to a submount or PCB. The LED chips may then be coated and/or planarized according to the present invention to expose the pedestal for contacting.

Figure 6:
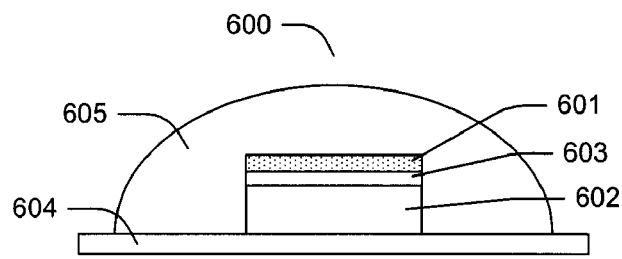
FIG. 6 is a cross-sectional view of light emitting diodes according to various embodiments of the present invention.
Figure 7:
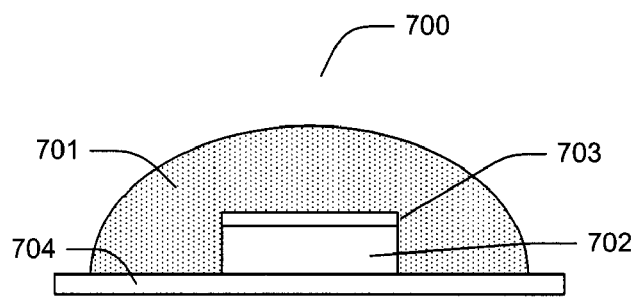
FIG. 7 is a cross-sectional view of light emitting diodes according to various embodiments of the present invention.

According to some embodiments of the present invention, FIG. 6 represents a packaged LED device 600. The device 600 may comprise an LED layer 602, a filter layer 603, and a light conversion layer 601, all of which may be formed according to wafer level and/or individual chip embodiments previously disclosed. The LED layer 602 may be mounted to a submount 604, such as a printed circuit board (PCB), or a metal-core printed circuit board (MCPCB). A conventional encapsulation layer 605 may then surround layers 601, 602, and 603 on submount 604. The encapsulation 605 may comprise epoxy, silicone, glass, plastic, etc. FIG. 7 represents a packaged LED device 700 according to other embodiments of the present invention. The device 700 may comprise an LED layer 702, a filter layer 703, and a submount 704 according to previous embodiments. The encapsulation 701 may then comprise light conversion materials, such as phosphor loaded epoxy or silicone.

Figure 8:
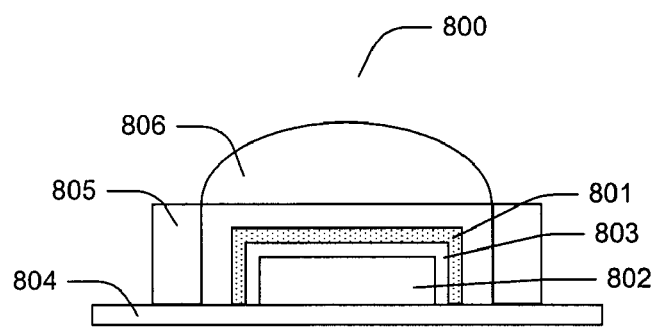
FIG. 8 is a cross-sectional view of light emitting diodes according to various embodiments of the present invention.

FIG. 8 represents alternative embodiments where a packaged LED device 800 may comprise an LED layer 802, a filter layer 803, and light conversion layer 801 according to previous embodiments. The device 800 may further comprise a lens 806 on a lens support 805. The lens support 805 may surround and be reflective to light generated by the LED layer 802, filter layer 803, and light conversion layer 801. In some embodiments of the present invention, and as shown in FIG. 7, the filter layer 803 and light conversion layer 801 may extend down the sidewalls of LED layer 802. In other embodiments, the filter layer and light conversion layer may only be on a top surface of the LED layer.

Figure 9:
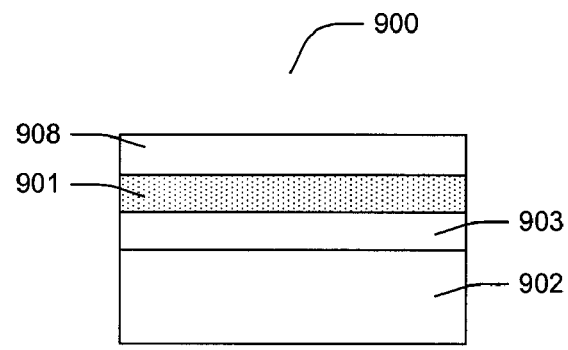
FIG. 9 is a cross-sectional view of light emitting diodes according to various embodiments of the present invention.

In other embodiments of the present invention, additional or intervening layers may be present. For example, the LED chip 900 of FIG. 9 may comprise an LED layer 902, a filter layer 903, and a light conversion layer 901 according to previous embodiments. The chip 900 may comprise a light scattering layer 908. The light scattering layer 908 may be any material or combination of materials that scatters or diffuses light generated or converted within the chip, such as converted light from the light conversion layer, to improve the spatial color temperature uniformity of overall light emitted. The light scattering layer 908 may be a conformally coated layer on light conversion layer 901 and filter layer 903. The light scattering layer may also be in other locations within LED packages such as in a lens and/or an encapsulant. Light scattering particles such as $TiO_2$, fumed $SiO_2$, $Al_2O_3$, $Ba_2SO_4$, etc, mixed in a silicone binder may be used for the light scattering layer.

Figure 10:
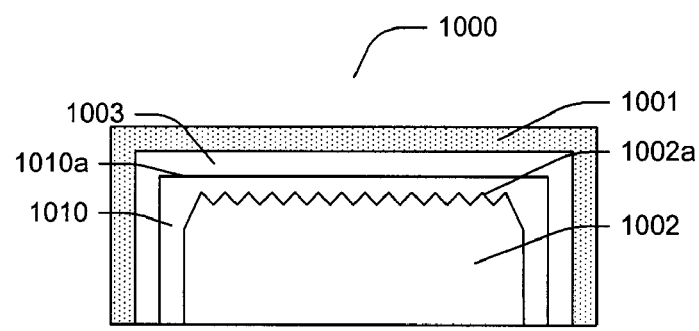
FIG. 10 is a cross-sectional view of light emitting diodes according to various embodiments of the present invention.

As mentioned above, various surfaces of LEDs may have patterned, textured, or non-planar surfaces. In some examples of the present invention, it may be desired to have filter layers with uniform thicknesses, parallel opposing surfaces, and/or flat surfaces. For LEDs with non-planar surfaces, an intervening layer, or a spacer layer, may be used to provide a planar surface for the filter layer. As shown in FIG. 10, LED chip 1000 includes an LED layer 1002 with a non-planar surface 1002a and a spacer layer 1010 on the non-planar surface 1002a. The spacer layer 1010 may have a planar surface 1010a on a side opposite the non-planar surface 1002a of the LED layer. In some embodiments, a planar surface may have a roughness in the range of 1-100 nm. Filter layer 1003 may then be provided on planar surface 1010a and light conversion layer 1001 may be provided on filter layer 1003. Spacer layer 1010 may be a thin layer of silicone, SiO2, TiO2, Al2O3, or various other amorphous dielectrics or oxides. However, it may still be thick enough to cover the non-planar surface 1002a and provide a planar surface 1010a. In some embodiments, the spacer layer may have a thickness in the range of 0.5-20 μm. The spacer layer may be formed by spin-coating or various other conventional thin-film deposition techniques. The spacer layer may provide a planar surface as formed, or it may require additional processing steps including known mechanical or chemical processes such as grinding, lapping, polishing, the use of a squeegee, and physical or chemical etching. The spacer layer may further function as passivation or protection for the LED and any of its textured or non-planar surfaces. In some embodiments, the spacer layer may have an index of refraction in the range of 1.5-1.8.

Figure 11:
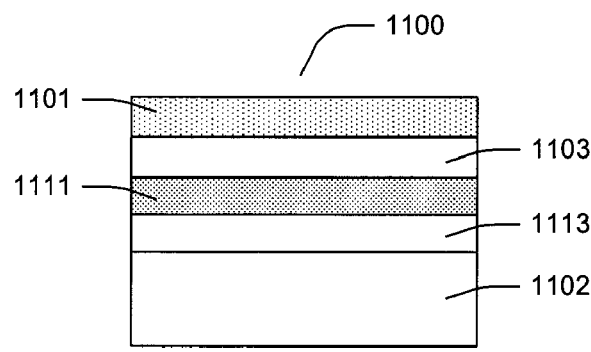
FIG. 11 is a cross-sectional view of light emitting diodes according to various embodiments of the present invention.
Figure 12A:
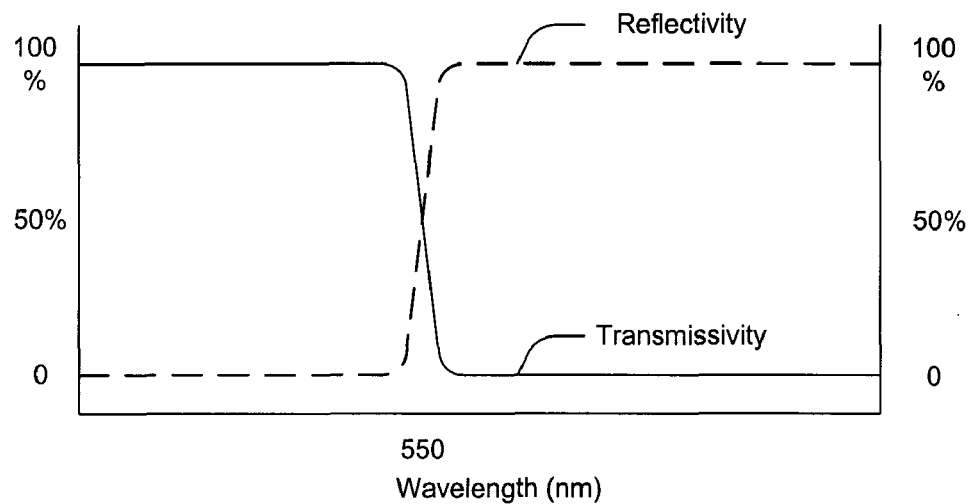
FIGS. 12A-12D are graphs depicting materials properties and light spectrum according to various embodiments of the present invention.
Figure 12B:
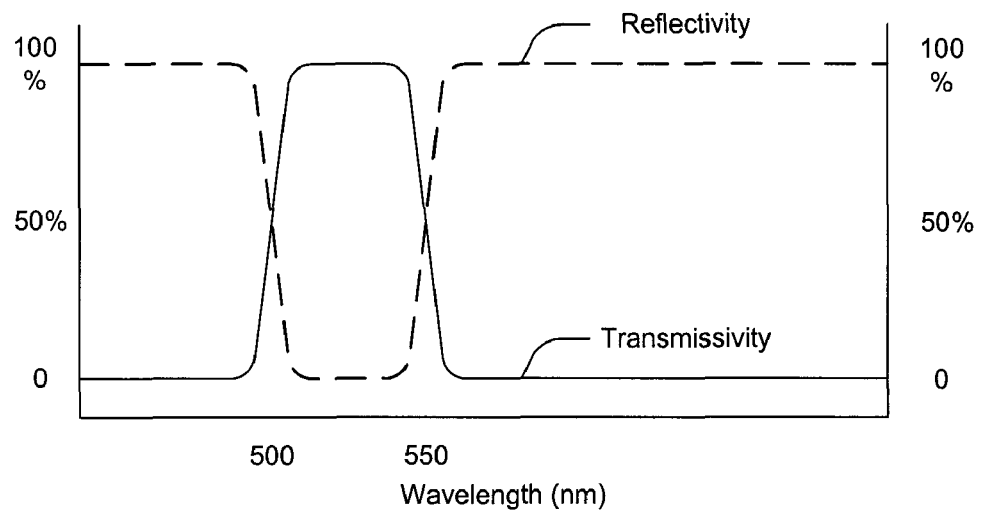
Figure 12C:
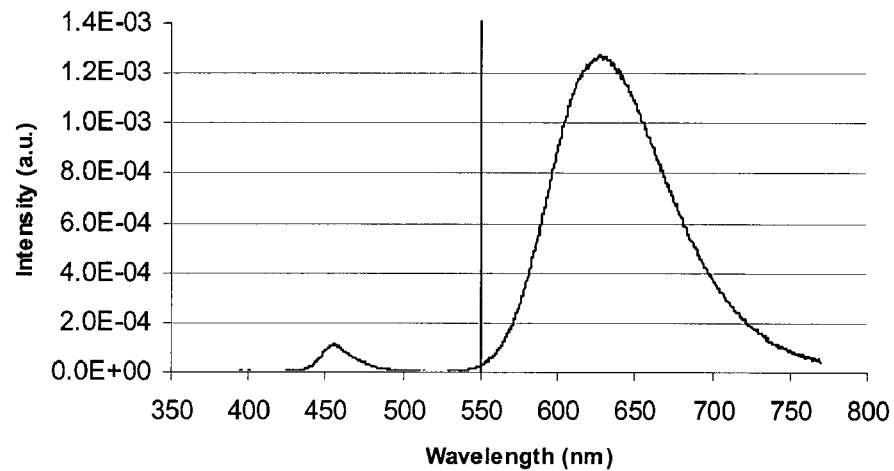
Figure 12D:
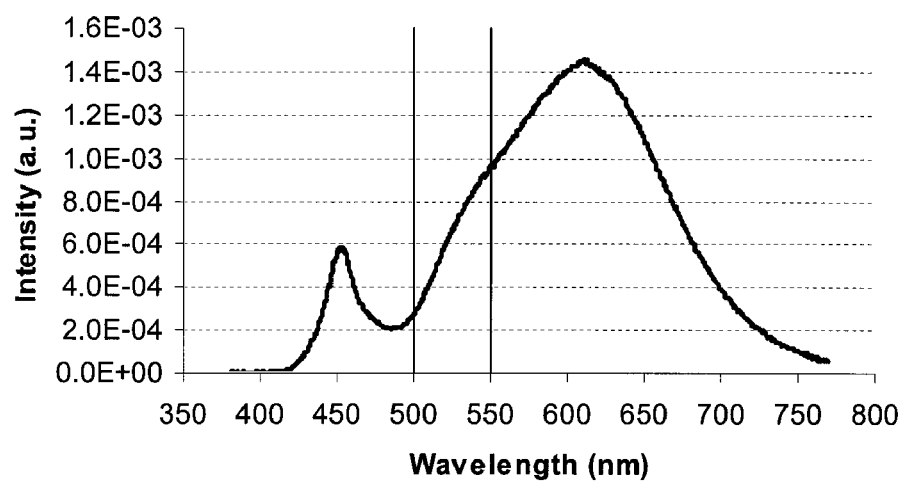

As shown in FIG. 11, some embodiments of the present invention may have multiple filter layers and multiple light conversion layers. For example, the LED chip 1100 may include LED layer 1102, a first light filter layer 1113, a first light conversion layer 1111, a second light filter layer 1103, and a second light conversion layer 1101. The multiple filter layers and light conversion layers may be different layers. For example, first light conversion layer 1111 may be a red and/or orange phosphor layer and second light conversion layer 1101 may be a green and/or yellow phosphor layer. First light filter layer 1113 may then be an edge filter that transmits light below 550 nm and is reflective of light above 550 nm, as shown in FIG. 12A. Second light filter layer 1103 may then be a band pass filter that reflects light between 500-550 nm and transmits light below 500 nm and above 550 nm, as shown in FIG. 12B. LED layer 1102 may emit blue light than passes through first light filter layer 1113 and at least a portion of which may be converted to red and/or orange light in the first light conversion layer 1111. Blue and red and/or orange light may then pass through second filter layer 1103, at least a portion which may be converted to green and/or yellow light in second light conversion layer 1101. The resulting LED chip 1100 may then emit a red and/or orange-tinted, or warm white light. The first light filter layer 1113, being reflective to light above 550 nm, may prevent red light from the first light conversion layer 1111 from traveling back towards LED layer 1102 and being subject to potential optical losses. FIG. 12C shows an example red emission spectrum with a single vertical line to represent the amount of red light reflected by an edge filter at 550 nm. The second light filter layer 1103, being reflective to light between 500 and 550 nm, may prevent yellow and/or green light from the second light conversion layer 1101 from traveling back towards light conversion layer 1111 and LED layer 1102 and being subject to re-absorption and/or potential optical losses. FIG. 12D shows an example warm white emission spectrum, including blue, red and yellow/green emissions, with two vertical lines to represent the amount of yellow and/or green light reflected by a band pass filter at 500 and 550 nm.

Figure 13:
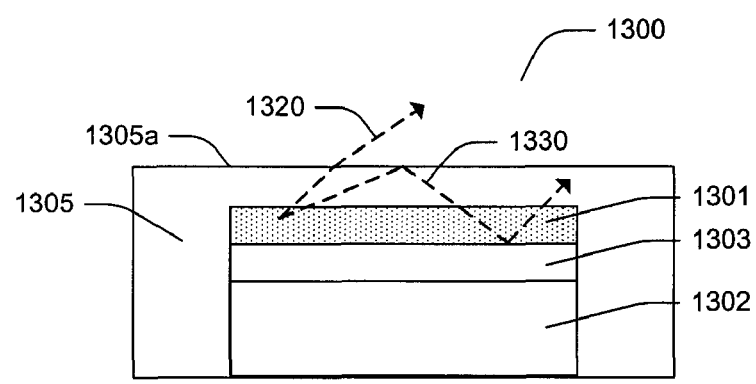
FIG. 13 is a cross-sectional view of light emitting diodes according to various embodiments of the present invention.

Some embodiments of the present invention may include a flat encapsulation layer or lens. A flat encapsulation layer or lens may provide an LED with a lower profile, however, a flat surface of the flat encapsulation may increase the amount of light directed back into the chip/package by total internal reflection at the flat surface and/or fresnel reflection. The encapsulation layer or lens may include a molded layer or a conformal coating of materials such as silicon, epoxy, glass, plastic, etc. FIG. 13 shows an LED chip 1300 that includes an LED layer 1302, a filter layer 1303, and a light conversion layer 1301 as previously described. The LED chip may further include an encapsulation layer 1305 with a flat surface 1305a on the light conversion layer 1301. As previously described, LED layer 1302 may emit light of a first wavelength and light conversion layer 1301 may convert at least a portion of the light of a first wavelength to light of a second wavelength. Filter layer 1303 may be transmissive to the light of a first wavelength and reflective to light of a second wavelength. A first portion of the light of a second wavelength 1320 may escape the LED chip 1300 on first pass and second portion of the light of a second wavelength 1330 may be subject to fresnel reflection and/or total internal reflection at flat surface 1305a. However, filter layer 1303 may be reflective to all light of a second wavelength and thereby prevent it from being subject to internal absorption or other optical losses within the LED chip.

Other embodiments of the present invention may include LED packages with multiple LED chips. In such embodiments, a filter layer may be on at least one LED chip wherein the filter layer is transmissive to light generated by the LED chip but reflective of light generated by at least another LED In some examples, an LED package may include at least a red, green, and blue LED chip that may collectively be configured to emit white light and wherein a filter layer is on at least one of the LED chips. In an example where the filter layer is on a blue LED, the filter layer may be configured to be transmissive to blue light and reflective to the green and/or red light. A separate filter layer may be on each individual LED configured such that the filter layer is transmissive to the wavelength of the individual LED, but reflective to any different wavelengths emitted by other LEDs within the package. In various examples, a light conversion layer may be on at least one of the LED chips, such as an LED package that includes at least one blue LED with a light conversion layer and at least one red LED and wherein a filter layer is on at least one of the LED chips. In various embodiments, a filter layer may be on at least an LED chip with a light conversion layer and an LED chip with no light conversion layer; or a filter layer may only be on the LED chip or chips with a light conversion layer; or a filter layer may only be on the LED chip or chips without a light conversion layer.

Figure 14:
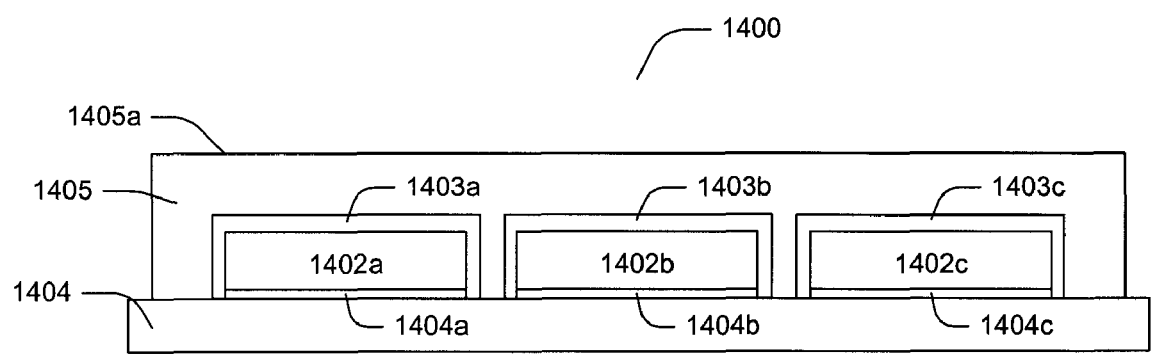
FIG. 14 is a cross-sectional view of light emitting diodes according to various embodiments of the present invention.

For an example of a multi-chip package, FIG. 14 shows an LED package 1400 that includes multiple LED chips 1402a, 1402b, and 1402c on a submount 1404. In some examples, such as those where the LEDs are flip-chip mounted, the LED chips may also include reflector layers 1404a, 1404b, and 1404c as previously described. Filter layers 1403a, 1403b, and 1403c may be on each of LED chips 1402a, 1402b, and 1402c respectively. The filter layers may conformally coat the top and sides of each LED chip. An encapsulation layer 1405 may be on the LED chips and on the submount 1404 and may be a flat encapsulant that includes at least one flat surface 1405a as describe above. A single encapsulant may continuously cover all LED chips within the package, or on individual encapsulant may be separately on each individual LED chip. LED chip 1402a may emit light of a first wavelength, for example blue, and its filter layer 1403a may be transmissive to light of a first wavelength but reflective to light of other wavelengths. LED chip 1402b may emit light of a second wavelength, for example green, and its filter layer 1403b may be transmissive to light of a second wavelength but reflective to light of other wavelengths. LED chip 1402c may emit light of a third wavelength, for example red, and its filter layer 1403c may be transmissive to light of a third wavelength but reflective to light of other wavelengths. As a result, light emitted by an LED chip of one wavelength may not be lost to absorption or other optical losses within an LED chip of a different wavelength.

In some embodiments of the present invention, a multiple lamp LED fixture may include at least two separately packaged LED lamps of different colors. Each LED lamp may include one or more LED chips of the same color on a submount and an encapsulant or lens on the one or more LED chips and the submount. At least one of the LED lamps may include a filter layer that is transmissive to the light emitted by the LED or LEDs within the lamp and is reflective to light emitted by other LED lamps within the fixture.

Although the present invention has been described in detail with reference to certain configurations thereof, other versions are possible. Therefore, the spirit and scope of the invention should not be limited to the version described above.

That which is claimed is:

1. A light emitting diode (LED) chip comprising:
   an LED layer capable of emitting light of a first wavelength;
   a light conversion layer on the LED layer capable of converting at least a portion of the light of a first wavelength to light of a second wavelength;
   a filter layer between the LED layer and the light conversion layer that is transmissive to light of the first wavelength and reflective to light of the second wavelength, the filter layer being directly on at least a portion of the LED layer; and
   a pedestal in electrical contact with the LED layer and extending through both the filter layer and the light conversion layer, wherein a top surface of the pedestal is co-planar with a top surface of the light conversion layer.

2. The LED chip of claim 1 wherein the light conversion layer is directly on at least a portion of the filter layer.

3. The LED chip of claim 1 wherein the pedestal is exposed at the surface of the light conversion layer.

4. The LED chip of claim 1 that is configured to emit white light.

5. The LED chip of claim 1 wherein the LED is on a substrate.

6. The LED chip of claim 5 wherein the substrate comprises a growth substrate.

7. The LED chip of claim 5 wherein the substrate comprises a carrier substrate.

8. The LED chip of claim 7 wherein the LED layer is flip-chip mounted to the carrier substrate.

9. The LED chip of claim 7 further comprising a reflector layer that is between the carrier substrate and the LED layer.

10. The LED chip of claim 1 further comprising a contact on the LED layer wherein the pedestal is on the contact.

11. The LED chip of claim 10 wherein the filter layer is on a top surface of the contact.

12. The LED chip of claim 10 wherein a width of the pedestal is different than a width of the contact.

13. The LED chip of claim 10 wherein the pedestal comprises a first material and the contact comprises a second material that is different than the first material.

14. The LED chip of claim 1 wherein the light conversion layer comprises a phosphor material.

15. The LED chip of claim 1 wherein the LED layer comprises one or more layers of materials from the Group III-nitride material system.

16. The LED chip of claim 1 wherein the filter layer is transmissive to light between and including 400 nm and 500 nm and is reflective to light below 400 nm and above 500 nm.

17. The LED chip of claim 1 wherein the filter layer is transmissive to light below and including 500 nm and is reflective to light above 500 nm.

18. The LED chip of claim 1 wherein the LED layer has a first index of refraction and the light conversion layer and the filter layer have the same second index of refraction.

19. The LED chip of claim 1 wherein the LED layer has a first index of refraction, the light conversion layer has a second index of refraction, and the filter layer has a third index of refraction that is intermediate the first index of refraction and the second index of refraction.

20. The LED chip of claim 1 wherein a surface of the LED layer is non-planar, patterned, or textured.

21. The LED chip of claim 20 further comprising a spacer layer on the non-planar, patterned, or textured surface of the LED layer and wherein the filter layer is on a surface of the spacer layer opposite the LED layer.

22. The LED chip of claim 1 further comprising a second light conversion layer and a second filter layer, wherein the second light conversion layer is capable of converting at least a portion of light of the first wavelength to light of a third wavelength.

23. The light emitting device of claim 1, further comprising a light scattering layer and wherein the reflector includes at least one of silver, nickel silver, platinum, aluminum, or a distributed Bragg reflector.

24. A light emitting diode (LED) chip comprising:
an LED layer capable of emitting light of a first wavelength, wherein the LED layer comprises an n-type layer and a p-type layer on opposing sides of an active layer;
a reflector layer on a first side of the LED layer closest to the p-type layer;
a light conversion layer on a second side the LED layer, opposite the first side, capable of converting at least a portion of the light of a first wavelength to light of a second wavelength;
a filter layer between the LED layer and the light conversion layer that is transmissive to light of the first wavelength and reflective to light of the second wavelength, the filter layer being directly on at least a portion of the LED layer; and
a pedestal in electrical contact with the LED layer and extending through both the filter layer and the light conversion layer, wherein a top surface of the pedestal is co-planar with a top surface of the light conversion layer.

25. A light emitting diode (LED) chip comprising:
an LED layer capable of emitting light of a first wavelength;
a light conversion layer on the LED layer capable of converting at least a portion of the light of a first wavelength to light of a second wavelength;
a filter layer between the LED layer and the light conversion layer that is transmissive to light of the first wavelength and reflective to light of the second wavelength, the filter layer being directly on at least a portion of the LED layer;
an encapsulation layer on the filter layer wherein the light conversion layer is between the encapsulation layer and the filter layer and the encapsulation layer includes at least one flat surface that is spaced apart from the light conversion layer; and
a pedestal in electrical contact with the LED layer and extending through both the filter layer and the light conversion layer.

26. A light emitting diode (LED) package comprising:
a first LED chip capable of emitting light of a first wavelength;
a second LED chip capable of emitting light of a second wavelength, different than the first wavelength;
a filter layer on the first LED chip that is transmissive to light of the first wavelength and reflective to light of the second wavelength, wherein the filter layer is configured to reduce light from the second LED chip from entering the first LED chip;
a common encapsulation layer that covers both the first LED chip and the second LED chip;
a submount wherein the first and second LED chips are on the submount;
a reflector layer that is between at least one of the first and second LEDs and the submount; and
wherein the first LED chip and second LED chip are separate from one another.

27. The LED package of claim 26 wherein the light of the first wavelength is one of red, green, or blue.

28. The LED package of claim 26 wherein the light of the second wavelength is one of red, green, or blue.

29. The LED package of claim 26 wherein at least one of the first and second LED chips further comprises a light conversion layer.

30. The LED package of claim 26 wherein the encapsulation layer includes at least one flat surface.

31. The LED package of claim 26 wherein the encapsulation layer contains light scatterers.

32. The LED package of claim 26 further comprising multiple LED chips capable of emitting light of the first wavelength and multiple LED chips capable of emitting light of the second wavelength.

33. A light emitting diode (LED) package comprising:
a first LED chip capable of emitting light of a first wavelength;
a second LED chip capable of emitting light of a second wavelength, different than the first wavelength;
a filter layer on the first LED chip that is transmissive to light of the first wavelength and reflective to light of the second wavelength, wherein the filter layer is configured to reduce light from the second LED chip from entering the first LED chip;
a common encapsulation layer that covers both the first LED chip and the second LED chip;
a second filter layer on the second LED chip that is transmissive to light of the second wavelength and reflective to light of the first wavelength; and
wherein the first LED chip and second LED chip are separate from one another.

34. The LED package of claim 33 further comprising;
a third LED chip capable of emitting light of a third wavelength, different than the first wavelength and the second wavelength; and
a third filter layer on the third LED chip that is transmissive to light of the third wavelength and reflective to light of the first wavelength and light of the second wavelength.

* * * * *